United States Patent
Cantudo Franco et al.

(10) Patent No.: US 12,069,785 B2
(45) Date of Patent: Aug. 20, 2024

(54) DETECTOR DEVICE AND AUTOMOTIVE LIGHTING DEVICE

(71) Applicant: VALEO VISION, Bobigny (FR)

(72) Inventors: Miguel Angel Cantudo Franco, Martos (ES); Manuel Calmaestra Fortis, Martos (ES)

(73) Assignee: VALEO VISION, Bobigny (FR)

( * ) Notice: Subject to any disclaimer, the term of this patent is extended or adjusted under 35 U.S.C. 154(b) by 514 days.

(21) Appl. No.: 17/278,529

(22) PCT Filed: Sep. 17, 2019

(86) PCT No.: PCT/EP2019/074902
§ 371 (c)(1),
(2) Date: Mar. 22, 2021

(87) PCT Pub. No.: WO2020/064439
PCT Pub. Date: Apr. 2, 2020

(65) Prior Publication Data
US 2022/0032842 A1 Feb. 3, 2022

(30) Foreign Application Priority Data
Sep. 24, 2018 (EP) .................................... 18382682

(51) Int. Cl.
*G01R 31/00* (2006.01)
*B60Q 1/34* (2006.01)
(Continued)

(52) U.S. Cl.
CPC .............. *H05B 45/50* (2020.01); *B60Q 1/34* (2013.01); *B60Q 1/44* (2013.01); *B60Q 11/00* (2013.01);
(Continued)

(58) Field of Classification Search
CPC ..... G01R 31/006; G01R 31/26; B60Q 11/005
See application file for complete search history.

(56) References Cited

U.S. PATENT DOCUMENTS

2005/0225266 A1* 10/2005 Sato ..................... B60Q 11/005
315/225
2006/0087843 A1 4/2006 Setomoto et al.
(Continued)

FOREIGN PATENT DOCUMENTS

CN 102378459 A 3/2012
CN 202799274 U 3/2013
(Continued)

OTHER PUBLICATIONS

Combined Chinese Office Action and Search Report issued Feb. 11, 2023 in Chinese Patent Application No. 201980062412.8 (with English Summary of Office Action only), 13 pages.
(Continued)

*Primary Examiner* — Thang X Le
(74) *Attorney, Agent, or Firm* — Oblon, McClelland, Maier & Neustadt, L.L.P.

(57) ABSTRACT

The present invention refers to a detector device for detecting a status of at least a first electronic element of an automotive lighting device. This detector device comprises a status detection unit configured to detect a status of the at least first electronic element and to generate a reference signal which depends at least on the status of the first electronic element. It also comprises a comparison signal generator configured to generate a comparison signal and a comparison unit configured to generate a pulse-width modulation signal by comparing the reference signal with the comparison signal.

18 Claims, 2 Drawing Sheets

(51) Int. Cl.
  *B60Q 1/44* (2006.01)
  *B60Q 11/00* (2006.01)
  *F21S 43/20* (2018.01)
  *H05B 45/50* (2022.01)

(52) U.S. Cl.
  CPC ............ *F21S 43/26* (2018.01); *G01R 31/006* (2013.01); *B60Q 2400/20* (2013.01)

(56) References Cited

U.S. PATENT DOCUMENTS

| | | | |
|---|---|---|---|
| 2007/0090766 A1 | 4/2007 | LaGrave et al. | |
| 2010/0181914 A1 | 7/2010 | Kasaba et al. | |
| 2013/0015781 A1 | 1/2013 | Kanemitsu et al. | |
| 2015/0076999 A1* | 3/2015 | Malinin | H05B 45/46 |
| | | | 315/186 |
| 2015/0116635 A1 | 4/2015 | Kanemitsu et al. | |
| 2017/0034887 A1* | 2/2017 | Ichikawa | B60Q 1/04 |
| 2018/0177014 A1* | 6/2018 | Klinger | H05B 45/50 |
| 2018/0339642 A1* | 11/2018 | Kikuchi | F21S 41/19 |

FOREIGN PATENT DOCUMENTS

| | | |
|---|---|---|
| CN | 104838727 A | 8/2015 |
| EP | 2 420 407 A1 | 2/2012 |
| FR | 2 989 648 A1 | 10/2013 |
| JP | 7-215128 A | 8/1995 |
| JP | 2004-322982 A | 11/2004 |
| JP | 2012-40967 A | 3/2012 |
| JP | 2012040967 * | 3/2012 |
| JP | 2012-160436 A | 8/2012 |
| JP | 2013-21116 A | 1/2013 |
| JP | 2016-162598 A | 9/2016 |
| JP | 2018-8656 A | 1/2018 |
| JP | 2018-122637 A | 8/2018 |
| KR | 10-2016-0046986 A | 5/2016 |

OTHER PUBLICATIONS

International Search Report issued on Oct. 14, 2019 in PCT/EP2019/074902 filed on Sep. 17, 2019.
Office Action issued Apr. 8, 2022, in corresponding Japanese Patent Application No. 2021-516647 (English Translation only), 3 pages.
Office Action issued Sep. 5, 2023, in corresponding Japanese Patent Application No. 2022-202489 (with Summary of English Translation), 3 pages.
Combined Chinese Office Action and Search Report issued Feb. 22, 2024, in corresponding Chinese Patent Application No. 201980062414.8 (with English Translation of Category of Cited Documents), 9 pages.

\* cited by examiner

DETECTOR DEVICE AND AUTOMOTIVE LIGHTING DEVICE

TECHNICAL FIELD

This invention belongs to the field of lighting devices installed in automotive vehicles, and more specifically to the electronic devices used in the control of these automotive lighting devices.

STATE OF THE ART

Current automotive devices have a lot of electronic elements which may be required to be controlled. Information about the status of these elements may be handled and transmitted to different control units in order to manage the general operation of the vehicle.

Due to the increasing number of these tasks, the elements involved in this control and management must be fast and reliable, but the cost of them is also becoming an important feature, since the unitary cost is multiplied by a high number of these devices.

Micro-controllers and other software elements are useful to provide fast and reliable information about the statuses of these electronic devices, but are very expensive, so entrusting this information provision to these elements would lead to a substantial increase in the total cost of the electronics system.

However, a different approach is presented in this invention.

DESCRIPTION OF THE INVENTION

An alternative solution for the aforementioned problem is provided by a detector device according to claim 1 and an automotive lighting device according to claim 12. Particular embodiments of the invention are defined by dependent claims.

Unless otherwise defined, all terms (including technical and scientific terms) used herein are to be interpreted as is customary in the art. It will be further understood that terms in common usage should also be interpreted as is customary in the relevant art and not in an idealised or overly formal sense unless expressly so defined herein.

In this text, the term "comprises" and its derivations (such as "comprising", etc.) should not be understood in an excluding sense, that is, these terms should not be interpreted as excluding the possibility that what is described and defined may include further elements, steps, etc.

In a first inventive aspect, the invention provides a detector device for detecting a status of at least a first electronic element of an automotive lighting device, the detector device comprising

- a status detection unit configured to detect a status of the at least first electronic element and to generate a reference signal which depends at least on the status of the first electronic element;
- a comparison signal generator configured to generate a comparison signal;
- a comparison unit configured to generate a pulse-width modulation signal by comparing the reference signal with the comparison signal.

This comparison unit generates a PWM signal which is suitable for being sent to a general control unit of the automotive vehicle, since this PWM signal encodes the state of the at least first electronic element. This PWM signal generation is performed without software elements, such as micro-controllers. As a consequence, this provides an easy and cheap solution for communicating information of some devices to the general control unit.

In some particular embodiments, the status detection unit comprises a reference voltage generator which receives the at least first status signal and is configured to generate different values of reference signals depending on the status of the at least first electronic element, in such a way that the comparison unit is configured to generate a pulse-width modulation signal with a shape which depends on the reference signal.

This reference voltage generator is suitable for gathering the statuses of several electronic elements and for generating a single reference signal which feeds the comparison unit, this reference signal comprising the information of these statuses.

In some particular embodiments, the reference voltage generator comprises a switching block to generate different reference signals.

This switching block is an easy solution for providing different reference signals depending on the statuses received by the status detection unit.

In some particular embodiments, the detector device is further suitable for detecting a status of at least a second electronic element of the automotive lighting device, wherein the status detection unit is also configured to detect the status of at least the second electronic element and the reference signal depends also on the status of the at least second electronic element.

This detector device is suitable for managing the statuses of several electronic devices, and for generating a pulse-width modulation signal which encodes the statuses of all of them.

In some particular embodiments, the comparison unit is configured to generate the pulse-width modulation signal with a duty cycle which depends on the reference signal, in such a way that different status signals make the status detection unit generate different reference signals and this make the comparison unit generate pulse-width modulation signals with different duty cycles.

In these embodiments, the information is contained in the duty cycle of the pulse-width modulation signal, which is an easy way of communicating the information about the statuses.

In some particular embodiments, the comparison signal is a triangular signal. This triangular signal may be generated by a Schmitt trigger cell to provide an advantageous signal which may be used to generate the pulse-width modulation signal.

In some particular embodiments, the status is related to a failure status. Hence, the failure statuses of several electronic devices may be encoded in the pulse-width modulation signal, so that this information may be communicated to a central control unit of the automotive vehicle.

In some particular embodiments, the status detection unit comprises a transistor, such as a MOSFET or a BJT, for each of the electronic elements whose status is to be detected.

A transistor is a simple solution for generating a YES/NO signal so that a reference signal may encode a plurality of these signals. MOSFETs and BJTs are advantageous examples of transistors which may be used for this purpose.

In some particular embodiments, the detector device comprises more than one comparison unit and more than one status detection unit, each comparison unit receiving the same comparison signal and one reference signal from one of the status detection units, so that more than one pulse-width modulation signal may be produced at the same time.

In the event of a great number of electronic devices to be controlled, this solution may be scalable by providing more than one detection unit and more than one comparison unit.

In some particular embodiments, the first electronic element is a light source of one of a turning indicator, a tail function, a stop function, a reverse light or a fog lamp, or other lighting function.

These lighting functions are usually found in an automotive vehicle, and the statuses thereof is usually interesting in the general control of the operation of the vehicle.

In some particular embodiments, the light sources are solid-state light sources, such as light emitting diodes (LEDs).

The term "solid state" refers to light emitted by solid-state electroluminescence, which uses semiconductors to convert electricity into light. Compared to incandescent lighting, solid state lighting creates visible light with reduced heat generation and less energy dissipation. The typically small mass of a solid-state electronic lighting device provides for greater resistance to shock and vibration compared to brittle glass tubes/bulbs and long, thin filament wires. They also eliminate filament evaporation, potentially increasing the life span of the illumination device. Some examples of these types of lighting comprise semiconductor light-emitting diodes (LEDs), organic light-emitting diodes (OLED), or polymer light-emitting diodes (PLED) as sources of illumination rather than electrical filaments, plasma or gas.

In a third inventive aspect, the invention provides an automotive lighting device comprising a detector device according to the first inventive aspect.

This lighting device is particularly useful in automotive applications, for lighting functionalities wherein the detection of a failure in one of the light sources of any of them may of special interest.

In some particular embodiments, the lighting device further comprises a first optical element arranged to receive light from the plurality of light sources and to shape the light into a light pattern projected outside the lighting device.

An optical element is an element that has some optical properties to receive a light beam and emit it in a certain direction and/or shape, as a person skilled in automotive lighting would construe without any additional burden.

In some particular embodiments, the optical element is at least one of a light guide, a lens, a reflector or a collimator.

These optical elements are useful to manage the light produced by the plurality of light sources and provide uniform output.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The drawings comprise the following figures.

DETAILED DESCRIPTION OF THE INVENTION

Figure 1:
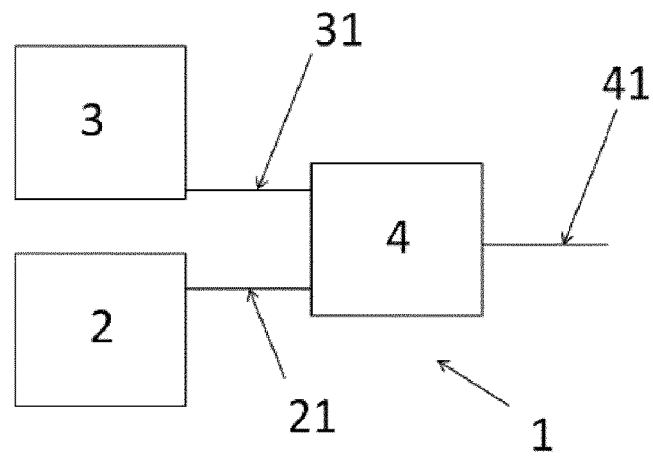
FIG. 1 shows a first general scheme of a detector device according to the invention.

The example embodiments are described in sufficient detail to enable those of ordinary skill in the art to embody and implement the systems and processes herein described. It is important to understand that embodiments can be provided in many alternate forms and should not be construed as limited to the examples set forth herein.

Accordingly, while embodiment can be modified in various ways and take on various alternative forms, specific embodiments thereof are shown in the drawings and described in detail below as examples. There is no intent to limit to the particular forms disclosed. On the contrary, all modifications, equivalents, and alternatives falling within the scope of the appended claims should be included. Elements of the example embodiments are consistently denoted by the same reference numerals throughout the drawings and detailed description where appropriate.

FIG. 1 shows a first general scheme of a detector device 1 according to the invention. This detector device 1 is suitable for detecting a status of a plurality of light sources 10 of an automotive lighting device.

The detector device 1 according to this embodiment comprises a status detection unit 2 configured to detect a status of the light sources 10 and to generate a reference signal 21 which depends at least on the status of the light sources;

a comparison signal generator 3 configured to generate a comparison signal 31;

a comparison unit 4 configured to generate a pulse-width modulation signal 41 by comparing the reference signal 21 with the comparison signal 31.

As a consequence, the detector device 1 receives the status of several light sources 10 and creates a pulse-width modulation signal which depends on these statuses, by the comparison of a comparison signal 31 with the reference signal generated by the status detection unit 2.

Figure 2:
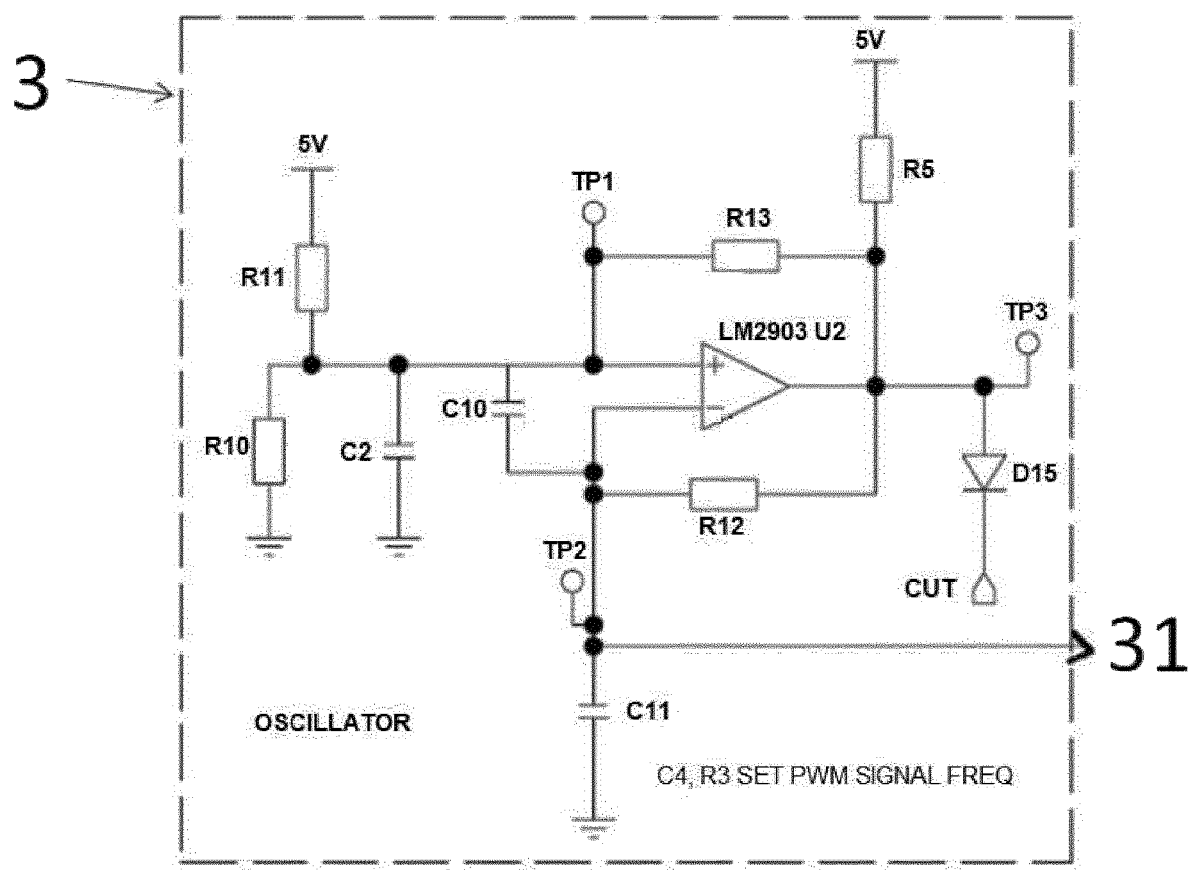
FIG. 2 shows an electric scheme of the comparison signal generator of the detector device according to the invention.

FIG. 2 shows an electric scheme of the comparison signal generator 3 of the detector device 1 according to the invention.

This comparison signal generator 3 generates a triangle signal 31 to be used as the comparison signal of the system. A Schmitt trigger cell is used in this embodiment to generate a triangle signal by means of charging and discharging a capacitor. The frequency of this triangle signal depends on the charge and discharge time; in other words, it depends on the capacitor value and may be tuned by choosing a suitable value for this element.

Figure 3:
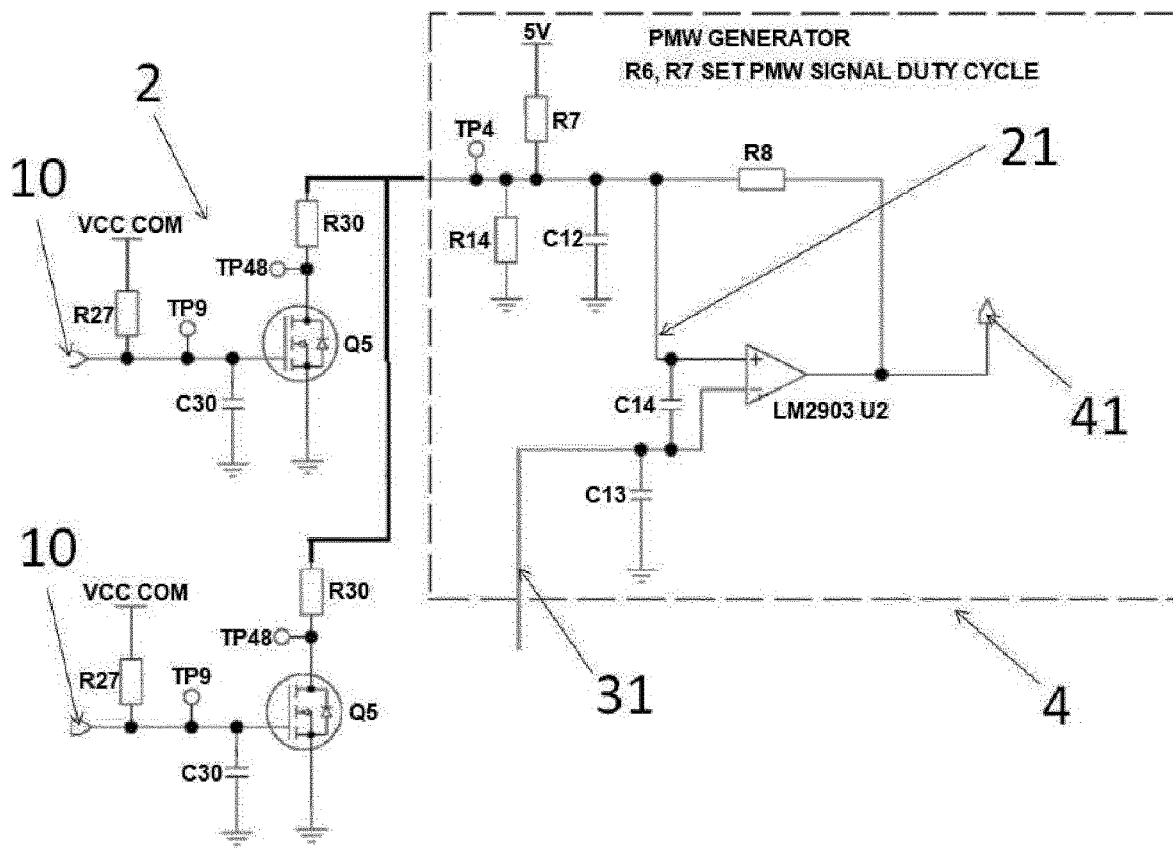
FIG. 3 shows an electric scheme of the status detection unit and the comparison unit of the detector device according to the invention.

FIG. 3 shows an electric scheme of the status detection unit 2 and the comparison unit 4 of the detector device 1 according to the invention.

The comparison unit 4 comprises a comparator which receives two signals: the triangle signal 31 generated by the comparison signal generator 3 and a reference signal 21 produced by the status detection unit 2. The comparator output is a PWM signal 41 with a predetermined frequency and a duty cycle which depends on the status of the elements 10, which are encoded in the reference signal 21. Hence, to generate different PWM levels (different PWM duty cycle values) different reference signals must be used. To do so, a switching block is used in this particular embodiment in order to provide different values of the reference signal, depending on the statuses of the elements to be monitored. This switching block comprises a MOSFET for each element 10.

Figure 4:
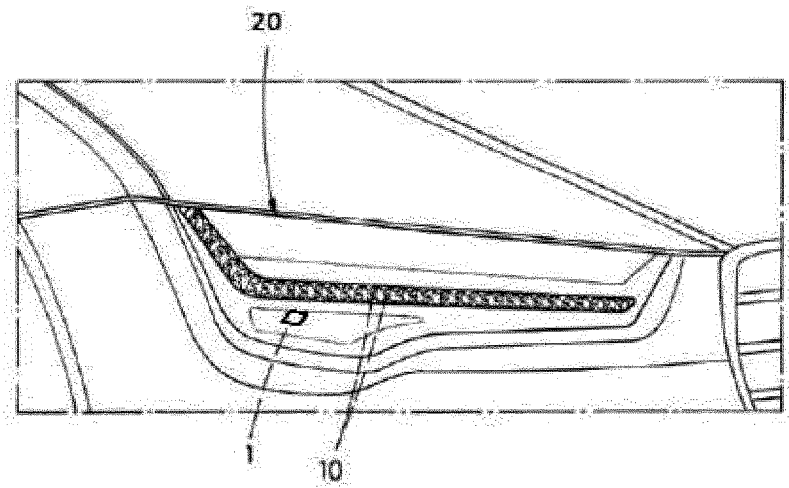
FIG. 4 shows a lighting device comprising an electronic assembly according to the invention.

FIG. 4 shows a lighting device 20 comprising an electronic assembly 1 according to the invention. This lighting device 20 comprises a turning indicator functionality with a plurality of LEDs 10, which may be activated by the vehicle user.

The detector device 1 of the invention is configured to provide a single pulse-width modulation signal which comprises information about the statuses of the LEDs 10 comprised in the turning indicator functionality, without using expensive software solutions or micro-controllers.

The invention claimed is:

1. A detector device for detecting a failure status of at least one solid state light source of an automotive lighting device, the detector device comprising:
   a status detection unit configured to detect the failure status of the at least one solid state light source and to generate a reference signal which depends at least on the failure status of the at least one solid state light source;
   a comparison signal generator configured to generate a comparison signal;
   a comparison unit configured to generate a pulse-width modulation signal by comparing the reference signal with the comparison signal such that the failure status of the at least one solid state light source is encoded in the pulse-width modulation signal.

2. The detector device according to claim 1, wherein the status detection unit comprises a reference voltage generator which receives the failure status signal and is configured to generate different values of reference signals depending on the failure status of the at least solid state light source, in such a way that the comparison unit is configured to generate a pulse-width modulation signal with a shape which depends on the reference signal.

3. The detector device according to claim 2, wherein the reference voltage generator comprises a switching block to generate different reference signals.

4. The detector device according to claim 1, being further suitable for detecting a failure status of at least a second solid state light source of the automotive lighting device, wherein the status detection unit is also configured to detect a failure status of at least the second solid state light source and the reference signal depends also on the failure status of the at least second solid state light source.

5. The detector device according to claim 1, wherein the comparison signal is a triangular signal.

6. The detector device according to claim 1, wherein the status detection unit comprises a transistor, such as a MOSFET or a BJT, for each of the solid state light sources whose status is to be detected.

7. The detector device according to claim 1, comprising more than one comparison unit and more than one status detection unit, each comparison unit receiving the same comparison signal and one reference signal from one of the status detection units, so that more than one pulse-width modulation signal may be produced at the same time.

8. The detector device according to claim 1, wherein the at least one solid state light source is a light source of one of a turning indicator, a tail function, a stop function, a reverse light or a fog lamp, or other lighting function.

9. The detector device according to claim 8, wherein the solid-state light sources are light emitting diodes (LEDs).

10. An automotive lighting device comprising a detector device according to claim 1.

11. The automotive lighting device according to claim 10, further comprising a first optical element arranged to receive light from the plurality of light sources and to shape the light into a light pattern projected outside the lighting device, the optical element being at least one of a lens, a light guide, a reflector or a collimator.

12. The detector device according to claim 2, being further suitable for detecting a failure status of at least a second solid state light source of the automotive lighting device, wherein the status detection unit is also configured to detect the failure status of at least the second solid state light source and the reference signal depends also on the failure status of the at least second solid state light source.

13. The detector device according to claim 2, wherein the comparison signal is a triangular signal.

14. The detector device according to claim 2, wherein the status detection unit comprises a transistor, such as a MOSFET or a BJT, for each of the solid state light source whose status is to be detected.

15. The detector device according to claim 2, comprising more than one comparison unit and more than one status detection unit, each comparison unit receiving the same comparison signal and one reference signal from one of the status detection units, so that more than one pulse-width modulation signal may be produced at the same time.

16. The detector device according to claim 2, wherein the first solid state light source is a light source of one of a turning indicator, a tail function, a stop function, a reverse light or a fog lamp, or other lighting function.

17. The automotive lighting device comprising a detector device according to claim 2.

18. A detector device for detecting a status of at least a first electronic element of an automotive lighting device, the detector device comprising
   a status detection unit configured to detect a status of the at least first electronic element and to generate a reference signal which depends at least on the status of the first electronic element;
   a comparison signal generator configured to generate a comparison signal; and
   a comparison unit configured to generate a pulse-width modulation signal by comparing the reference signal with the comparison signal,
      wherein the detector device being further suitable for detecting a status of at least a second electronic element of the automotive lighting device,
      wherein the status detection unit is also configured to detect the status of at least the second electronic element and the reference signal depends also on the status of the at least second electronic element, and
      wherein the comparison unit is configured to generate the pulse-width modulation signal with a duty cycle which depends on the reference signal, in such a way that different status signals make the status detection unit generate different reference signals and this make the comparison unit generate pulse-width modulation signals with different duty cycles.

* * * * *